US011432073B2

(12) United States Patent
Lei

(10) Patent No.: US 11,432,073 B2
(45) Date of Patent: Aug. 30, 2022

(54) LOUDSPEAKER ASSEMBLY, SOUND GENERATING APPARATUS AND ELECTRONIC DEVICE

(71) Applicant: HYTERA COMMUNICATIONS CORPORATION LIMITED, Shenzhen (CN)

(72) Inventor: Weiqiang Lei, Shenzhen (CN)

(73) Assignee: HYTERA COMMUNICATIONS CORPORATION LIMITED, Shenzhen (CN)

(*) Notice: Subject to any disclaimer, the term of this patent is extended or adjusted under 35 U.S.C. 154(b) by 91 days.

(21) Appl. No.: 17/010,862

(22) Filed: Sep. 3, 2020

(65) Prior Publication Data
US 2020/0404426 A1 Dec. 24, 2020

Related U.S. Application Data

(63) Continuation of application No. PCT/CN2018/078047, filed on Mar. 5, 2018.

(51) Int. Cl.
*H04R 9/02* (2006.01)
*H05K 9/00* (2006.01)

(52) U.S. Cl.
CPC ........... *H04R 9/025* (2013.01); *H05K 9/0084* (2013.01); *H04R 2209/022* (2013.01)

(58) Field of Classification Search
CPC ...... H04R 1/10; H04R 1/1075; H04R 1/2819; H04R 1/2849; H04R 1/2888;
(Continued)

(56) References Cited

U.S. PATENT DOCUMENTS 7,068,979 B2 * 6/2006 Pedersen ............. H04M 1/0202
381/345
2008/0044053 A1 * 2/2008 Belanger ................ H04R 1/023
381/386

(Continued)

FOREIGN PATENT DOCUMENTS

CN 201213307 Y 3/2009
CN 201887941 U 6/2011
(Continued)

OTHER PUBLICATIONS

Chinese First office action,Chinese Application No. 201810180078. 4, dated May 27, 2019 (9 pages).
(Continued)

*Primary Examiner* — Alexander Krzystan
*Assistant Examiner* — Julie X Dang

(57) ABSTRACT

A loudspeaker assembly and an electronic device are provided. The loudspeaker assembly includes: a loudspeaker body and a magnetic shielding cover. The magnetic shielding cover is arranged at a side of a sound radiation face of the loudspeaker body and defines a sound transmission hole. The magnetic shielding cover is a ferromagnetic cover. The magnetic shielding cover is configured to prevent at least partial magnetic flux at the side of the sound radiation face of the loudspeaker body from passing through the magnetic shielding cover and conduct the at least partial magnetic flux to an inertial magnetic field of the loudspeaker body. Magnetic induction of a portion of the magnetic shielding cover away from a periphery of the sound transmission hole is greater than that of a portion of the magnetic shielding cover close to the periphery of the sound transmission hole.

17 Claims, 6 Drawing Sheets

(58) Field of Classification Search
CPC .. H04R 2201/105; H04R 7/122; H04R 7/127; H04R 7/18; H04R 7/00; H04R 7/06; H04R 7/10; H04R 7/20; H04R 9/025; H04R 9/06; H04R 31/006; H04R 2231/003; H04M 1/1035
USPC ....... 381/345, 350, 351, 353, 354, 370, 372, 381/373, 380, 398
See application file for complete search history.

(56) References Cited

U.S. PATENT DOCUMENTS

| | | | |
|---|---|---|---|
| 2009/0291718 A1* | 11/2009 | Fukazawa | H04R 1/225 |
| | | | 455/575.1 |
| 2010/0304796 A1* | 12/2010 | Stohr | H04M 1/03 |
| | | | 381/396 |
| 2014/0056448 A1* | 2/2014 | Kuivalainen | H04R 1/02 |
| | | | 381/189 |
| 2014/0355812 A1 | 12/2014 | Inen et al. | |
| 2017/0238088 A1* | 8/2017 | Wen | H04R 1/2819 |
| | | | 381/373 |
| 2018/0152774 A1* | 5/2018 | Dong | H04R 7/12 |

FOREIGN PATENT DOCUMENTS

| | | | |
|---|---|---|---|
| CN | 202218288 U | | 5/2012 |
| CN | 103299653 A | | 9/2013 |
| CN | 203691625 U | | 7/2014 |
| CN | 204481806 U | | 7/2015 |
| CN | 105208481 A | * | 12/2015 |
| CN | 105208481 A | | 12/2015 |
| CN | 205793293 U | | 12/2016 |
| CN | 106488347 A | | 3/2017 |
| JP | 2000138995 A | * | 5/2000 |
| WO | WO2012114149 A1 | | 8/2012 |

OTHER PUBLICATIONS

Notification to Grant Patent Right for Invention,Chinese Application No. 201810180078.4, dated Nov. 12, 2019 (6 pages).
International search report, International Application No. PCT/CN2018/078047, dated Nov. 27, 2018 (6 pages).

* cited by examiner

LOUDSPEAKER ASSEMBLY, SOUND GENERATING APPARATUS AND ELECTRONIC DEVICE

CROSS REFERENCE TO RELATED APPLICATIONS

The present application is a continuation-application of International (PCT) Patent Application No. PCT/CN2018/078047 filed on Mar. 5, 2018, and the entire contents of which are hereby incorporated by reference in its entirety.

TECHNICAL FIELD

The present disclosure relates to the field of loudspeakers, and in particular to a loudspeaker assembly, a sound generating apparatus, and an electronic device.

BACKGROUND

Currently in the market, an apparatus, such as a conventional subwoofer, a small-sized Bluetooth subwoofer, a mobile phone, an intercom, a navigator, and the like, may be arranged with an electromagnetic transducer loudspeaker for loud speaking and may be referred as a sound generating mechanism. The loudspeaker in the art may include a magnetic-proof loudspeaker, and only a side of the loudspeaker opposite to a sound radiation face may be magnetic proof. Due to the sound radiation, a side of the loudspeaker facing the sound radiation may not be magnetic proof, such that magnetic leakage may be caused and damage the sound generating mechanism and magnetic sensitive element surrounding the sound generating mechanism.

Taking the intercom as an example, the intercom may be commonly used in an environment having a large amount of scrap iron, such as a steel mill. A shell of a sound radiation hole of the loudspeaker may be adsorbed with a large amount of scrap iron, and the large amount of scrap iron may be sucked into an inside of the loudspeaker, such that the loudspeaker may have a low volume and generate noise, and the loudspeaker may not be used normally. In another situation, the magnetic leakage may interfere other devices. For example, when two intercoms are positioned close to each other, signals and microphones may be interfered, and squealing may be generated, affecting user experience significantly.

SUMMARY OF THE DISCLOSURE

According to a first aspect of the present disclosure, a loudspeaker assembly may be provided and include: a loudspeaker body and a magnetic shielding cover. The magnetic shielding cover is arranged on a side of a sound radiation face of the loudspeaker body and defines a sound transmission hole. The magnetic shielding cover is made of ferromagnetic material. The magnetic shielding cover is configured to prevent at least partial magnetic flux on the side of the sound radiation face of the loudspeaker body from passing through the magnetic shielding cover, and configured to conduct the at least partial magnetic flux back to an inertial magnetic field of the loudspeaker body. Magnetic induction of a portion of the magnetic shielding cover away from a periphery of the sound transmission hole is greater than magnetic induction of a portion of the magnetic shielding cover close to the periphery of the sound transmission hole.

According to a second aspect of the present disclosure, a sound generating apparatus is provided and includes: a front shell and a back shell; a support; a loudspeaker body; and a magnetic shielding cover. The front shell and the back shell are engaged with each other to define a chamber. The support is received in the chamber. The loudspeaker body is received in the chamber and disposed between the support and the back shell. The loudspeaker has a sound radiation face for transmitting sound radiation to an outside of the sound generating apparatus, and the sound radiation face faces the front shell. The magnetic shielding cover is received in the chamber and disposed between the support and the front shell. The magnetic shielding cover defines a sound transmission hole. The magnetic shielding cover has a first portion close to a periphery of the sound transmission hole and a second portion away from the periphery of the sound transmission hole. The first portion has a first magnetic induction, the second portion has a second magnetic induction, the first magnetic induction is greater than the second magnetic induction.

According to a third aspect of the present disclosure, an electronic device is provided and includes the above-mentioned sound generating apparatus.

BRIEF DESCRIPTION OF THE DRAWINGS

In order to illustrate technical solutions of embodiments of the present disclosure more clearly, drawings required for describing the embodiments will be introduced in brief. Obviously, the drawings in the following may illustrate only some embodiments of the present disclosure. To any one ordinary skilled person in the art, other drawings may be obtained without making creative work.

FIG. 5a is a curve of magnetic flux intensity of the embodiment shown in FIG. 4a.

DETAILED DESCRIPTION

Figure 1A:
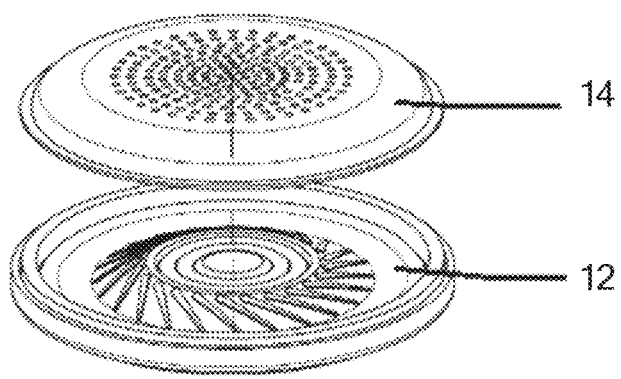
FIG. 1a is an explored view of a loudspeaker assembly according to an embodiment of the present disclosure.

Technical solutions of the embodiments of the present disclosure may be illustrated clearly and comprehensively by referring to the drawings. Obviously, the illustrated embodiments are only a part of, but not all of, the embodiments of the present disclosure. Based on the embodiments of the present disclosure, any other embodiments obtained by an ordinary skilled person in the art without any creative work should be within the scope of the present disclosure.

Figure 1B:
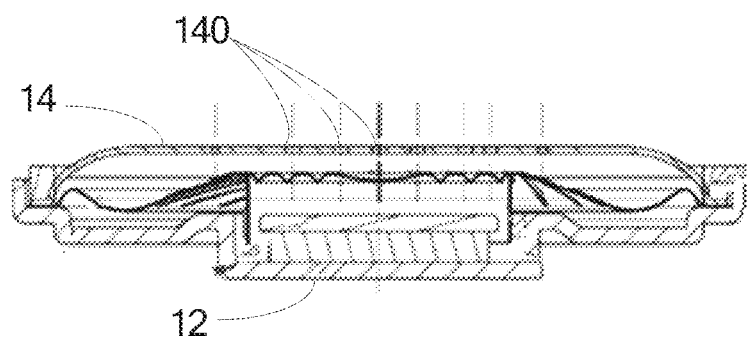
FIG. 1b is a cross-sectional view of a loudspeaker assembly according to an embodiment of the present disclosure.

As shown in FIG. 1a and FIG. 1b, FIG. 1a is an explored view of a loudspeaker assembly according to an embodiment of the present disclosure, and FIG. 1b is a cross sectional view of the loudspeaker assembly shown in FIG. 1a. In the present embodiment, the loudspeaker assembly may include: a loudspeaker body 12 and a magnetic shielding cover 14. The magnetic shielding cover 14 may be arranged on a side of a sound radiation face of the loudspeaker body 12. The magnetic shielding cover 14 may define a plurality of sound transmission holes 140. The magnetic shielding cover 14 may be made of ferromagnetic material. The magnetic shielding cover 14 may be configured to prevent at least partial magnetic flux at the side of the sound radiation face of the loudspeaker body 12 from passing through the magnetic shielding cover 14, and may conduct the at least partial magnetic flux back to an inertial magnetic field of the loudspeaker body 12. Magnetic induction of a portion of the magnetic shielding cover 14 away from a periphery of the sound transmission holes 140 may be greater than magnetic induction of a portion of the magnetic shielding cover 14 close to the periphery of the sound transmission holes 140, such that the scrap iron and the magnetic conductive substance may be prevented from being adsorbed to an inside of the loudspeaker assembly through the sound transmission holes 14.

It may be understood that, magnetic permeability of the ferromagnetic material may be significantly greater than magnetic permeability of air. Therefore, magnetic reluctance of the magnetic shielding cover 14 may be significantly less than magnetic reluctance of the air. When the magnetic flux at the side of the sound radiation face of the loudspeaker body 12 passes through the magnetic shielding cover 14, the magnetic flux may be turned to the inertial magnetic field of the loudspeaker body 12 through an inside of the magnetic shielding cover 14, and a complete magnet loop may be formed. Further, the magnetic shielding cover 14 may be configured to have a special structure to allow the magnetic induction of the portion of the magnetic shielding cover 14 away from the periphery of the sound transmission holes 140 to be greater than the magnetic induction of the portion of the magnetic shielding cover 14 close to the periphery of the sound transmission holes 140. For example, the magnetic shielding cover 14 may configured to include a first cover away from the periphery of the sound transmission holes 140 and a second cover close to the periphery of the sound transmission holes 140. Material of the first cover and material of the second cover may have different magnetic permeability. Alternatively, the first cover and the second cover may be configured to have different thicknesses. Alternatively, the different magnetic induction may be achieved by other means.

Figure 2A:
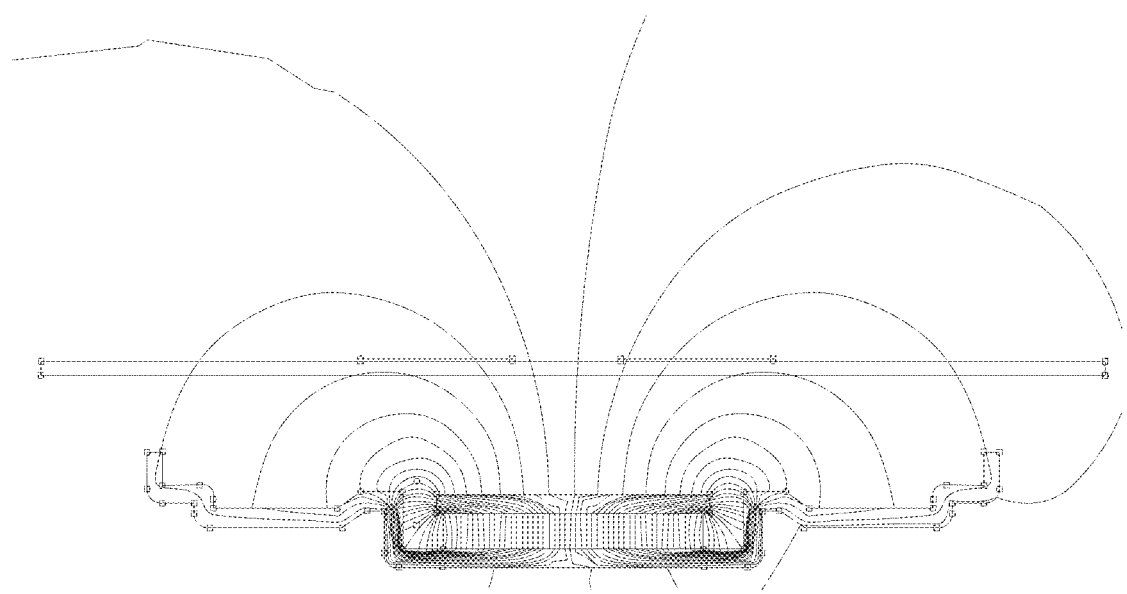
FIG. 2a is a view of magnetic field distribution of a loudspeaker assembly without a magnetic shielding cover.
Figure 2B:
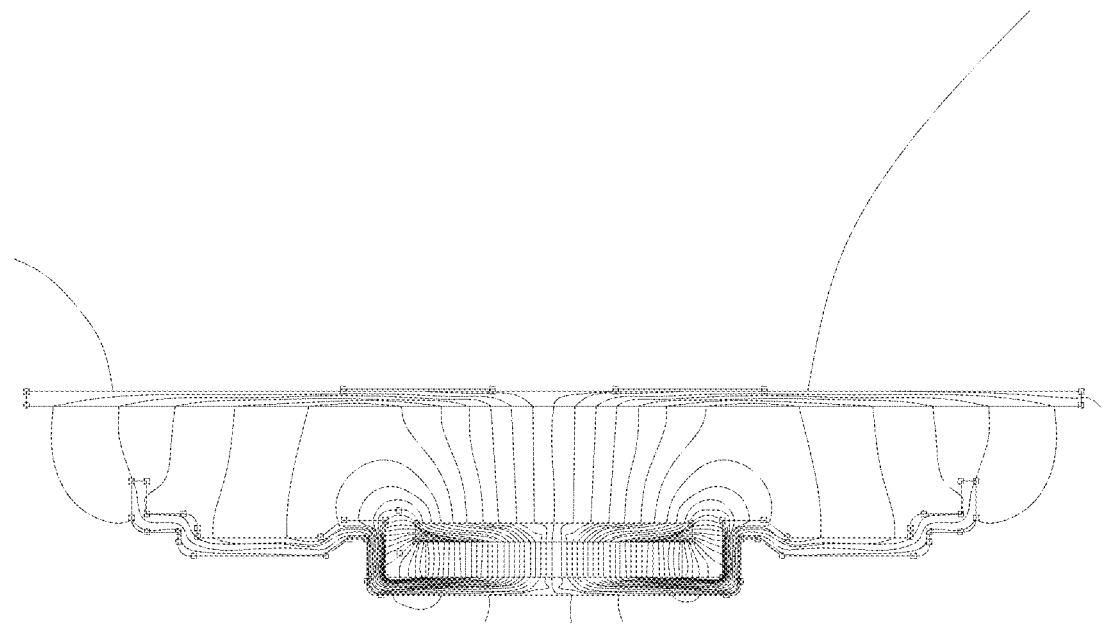
FIG. 2b is a view of magnetic field distribution of a loudspeaker assembly arranged with a magnetic shielding cover according to an embodiment of the present disclosure.

As shown in FIG. 2a and FIG. 2b, FIG. 2a and FIG. 2b are simulated rendering views of a loudspeaker assembly according to an embodiment of the present disclosure. FIG. 2a shows distribution of a magnetic field at the side of the sound radiation face of the loudspeaker 12 when the magnetic shielding cover 14 is not arranged. As shown in the figure, without the magnetic shielding cover 14, the magnetic flux at the side of the sound radiation face of the loudspeaker body 12 may be conducted back to the inertial magnetic field of the loudspeaker body 12 through the air.

FIG. 2b shows distribution of a magnetic field of the side of the sound radiation face of the loudspeaker 12 when the magnetic shielding cover 14 is arranged. When the magnetic shielding cover 14 is arranged, a vast majority of the magnetic flux on the side of the sound radiation face of the loudspeaker body 12 is conducted back to the inertial magnetic field of the loudspeaker body 12 through the magnetic shielding cover 14. Comparatively, the magnetic permeability of the ferromagnetic material is significantly greater than the magnetic permeability of a vacuum. Therefore, a distribution range of the magnetic field at the side of the sound radiation face of the loudspeaker body 12 when the magnetic shielding cover 14 is not arranged is significantly greater than that of the side of the sound radiation face of the loudspeaker body 12 when the magnetic shielding cover 14 is arranged. It may be understood that, magnetic permeability of non-ferromagnetic material is close to magnetic permeability of the vacuum. Therefore, when the magnetic shielding cover 14 is made of the non-ferromagnetic material, an effect of the magnetic flux of the side of the sound radiation face of the loudspeaker 12 not passing through the magnetic shielding cover and being conducted back to the inertial magnetic field of the loudspeaker body may not be achieved. Further, after the magnetic shielding cover 14 conducts magnet in the magnetic field, a direction of the magnetic field may be changed, such that the side of the sound radiation face of the loudspeaker assembly may hardly be magnetic, similar as a magnetite (for example, magnetism of two ends of a strip-shaped magnetite may be strong, and magnetism of another two sides of the strip-shaped magnetite may be close to 0). According to the results of the simulation, a small amount of magnetic flux may be shown at two ends. Therefore, the magnetic shielding cover 14 may be configured to shield the magnetic field, such that an outer side of the magnetic shielding cover 14 of the loudspeaker assembly may not be magnetic, and the scrap iron and the magnetic conductive substance may not be adsorbed to the loudspeaker assembly.

It may be understood that, as the magnetic induction of the portion of the magnetic shielding cover 14 away from the periphery of the sound transmission holes 140 is greater than the magnetic induction of the portion of the magnetic shielding cover 14 close to the periphery of the sound transmission holes 140, when the scrap iron and the magnetic conductive substance reach the periphery of the sound transmission holes 140, the scrap iron and the magnetic conductive substance may firstly be adsorbed to the portion having greater magnetic induction. That is, the scrap iron and the magnetic conductive substance may be adsorbed to the portion of the magnetic shielding cover 14 away from the periphery of the sound transmission holes 140, such that the scrap iron and the magnetic conductive substance may be prevented from entering the inside of the loudspeaker assembly through the sound transmission holes 140.

According to the loudspeaker assembly in the present embodiment, the magnetic shielding cover 14, which may be made of the ferromagnetic material, may be arranged on the side of the sound radiation face of the loudspeaker body 12, such that at least partial magnetic flux of the side of the sound radiation face of the loudspeaker body 12 may not pass through the magnetic shielding cover 14 and may be conducted back to the inertial magnetic field of the loudspeaker body 12. In this way, adsorbing the scrap iron and the magnetic conductive substance caused by the magnetic flux of the sound radiation face of the loudspeaker assembly may be limited effectively, and the magnetic flux interfering other magnetic sensitive devices may be limited effectively.

Further, as the magnetic reluctance of the ferromagnetic material is significantly less than the magnetic reluctance of the air, the magnetic shielding cover 14 may achieve the above-mentioned effect in a static magnetic field when the loudspeaker is not working.

In order to verify configuration of the above-mentioned loudspeaker assembly able to prevent the magnetic leakage, magnetic flux intensities of an intercom A, an intercom B, a loudspeaker assembly C unarranged with the magnetic shielding cover 14, and a loudspeaker assembly D arranged with the magnetic shielding cover 14 according to embodiments of the present disclosure are measured. Measurement shows that a maximum magnetic flux density of a front of a loudspeaker of the intercom A may be 29.7 mT, a maximum magnetic flux density of a front of a loudspeaker of the intercom B may be 35.9 mT; when the loudspeaker assembly is not arranged in the intercom, a maximum magnetic flux density of a front of the loudspeaker C unarranged with the magnetic shielding cover 14 may be 20.5 mT; and when the magnetic shielding cover 14 is arranged in the loudspeaker assembly D, a maximum magnetic flux density of a front of the loudspeaker assembly D is merely 0.3 mT. It is shown that, the magnetic flux density of the side of the sound radiation face of the loudspeaker assembly arranged with the magnetic shielding cover 14 is significantly less than that of the loudspeaker assembly not arranged with the magnetic shielding cover 14, indicating that the loudspeaker assembly provided in the embodiments of the present disclosure meets a configuration requirement.

Figure 3:
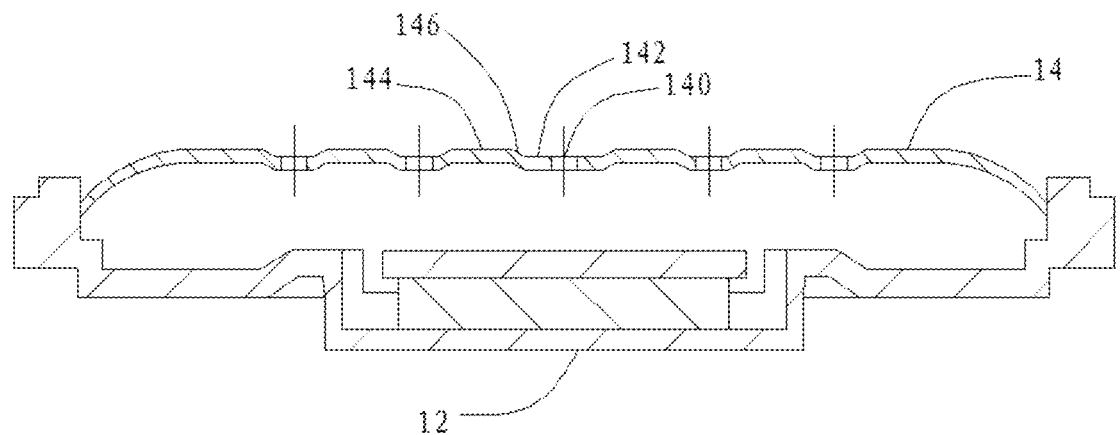
FIG. 3 is a structural schematic view of a loudspeaker assembly according to another embodiment of the present disclosure.

As shown in FIG. 3, FIG. 3 is a structural schematic view of a loudspeaker assembly according to another embodiment of the present disclosure. In the present embodiment, the magnetic shielding cover 14 may be a curved magnetic conductive plate. The magnetic shielding cover 14 may include a recessed portion 142 and a flat portion 144. The recessed portion 142 may be recessed towards the loudspeaker body 12. The flat portion 144 may protrude towards a side away from the loudspeaker body 12. The recessed portion 142 may be the portion of the magnetic shielding cover 14 close to the periphery of the sound transmission holes 140. The flat portion 144 may be the portion of the magnetic shielding cover 14 away from the periphery of the sound transmission holes 140. It may be understood that, the flat portion 144 in the present embodiment may be the first cover in the previous embodiment, and the recessed portion 142 may be the second cover in the previous embodiment.

In the present embodiment, the magnetic shielding cover 14 may further include a connection portion 146 configured to connect the recessed portion 142 with the flat portion 144. The connection portion 146 may be curved or flat. The magnetic shielding cover 14 may be configured to have a curved cross section, the periphery of the sound transmission holes 140 may be recessed, and two sides of the sound transmission holes 140 may be protruded to serve as the flat portion 144, such that the magnetic induction of the recessed portion 142 may be less than that of the flat portion 144, and the magnetic induction of the connection portion 146 may be greater than the magnetic induction of the other portions. When the scrap iron and the magnetic conductive substance reach the periphery of the sound transmission holes 140, the scrap iron and the magnetic conductive substance may firstly be adsorbed to the connection portion 146 and the flat portion 144, such that a possibility of the scrap iron and the magnetic conductive substance entering the inside of the loudspeaker assembly through the sound transmission holes 140 may further be reduced.

Figure 4A:
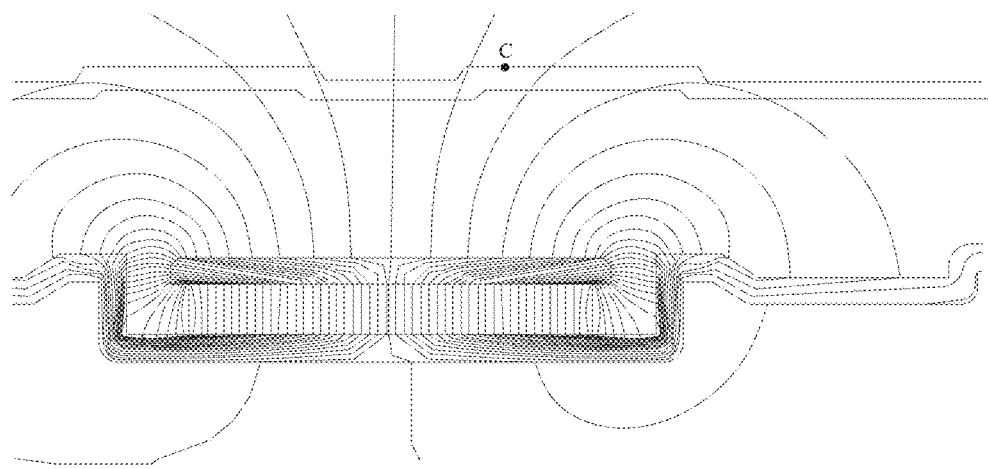
FIG. 4a is a simulated rendering view of a loudspeaker assembly unarranged with a magnetic shielding cover.
Figure 4B:
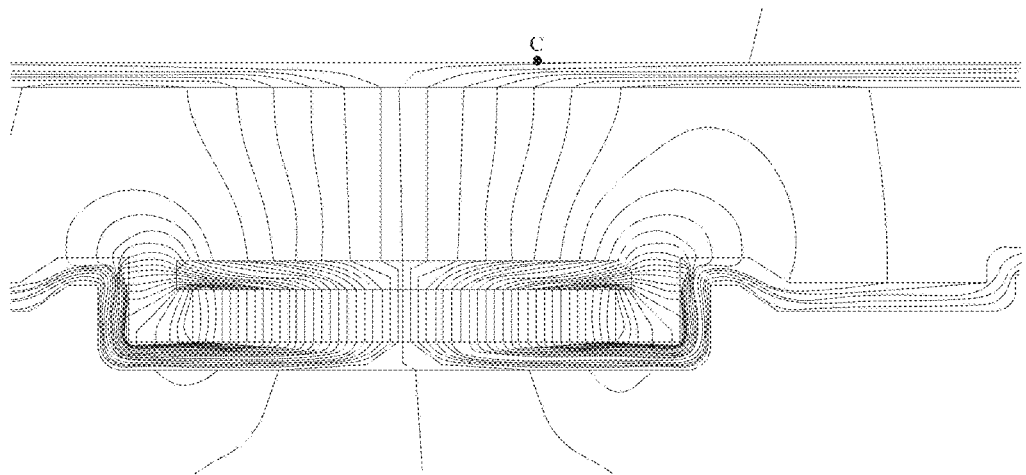
FIG. 4b is a simulated rendering view of a loudspeaker assembly arranged with a flat magnetic shielding cover.
Figure 4C:
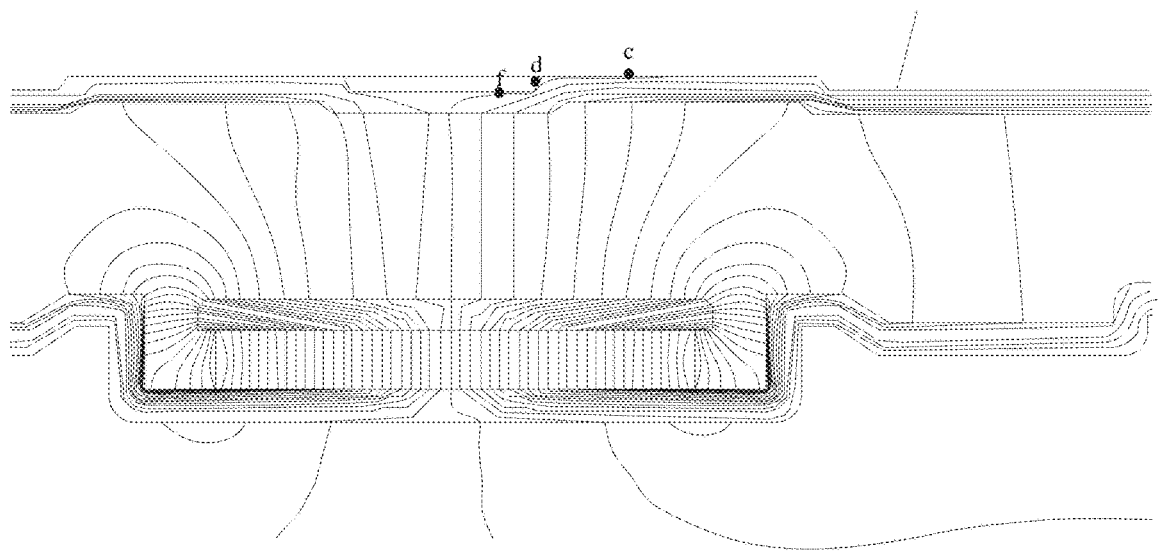
FIG. 4c is a simulated rendering view of a loudspeaker assembly arranged with a curved magnetic shielding cover.
Figure 5A:
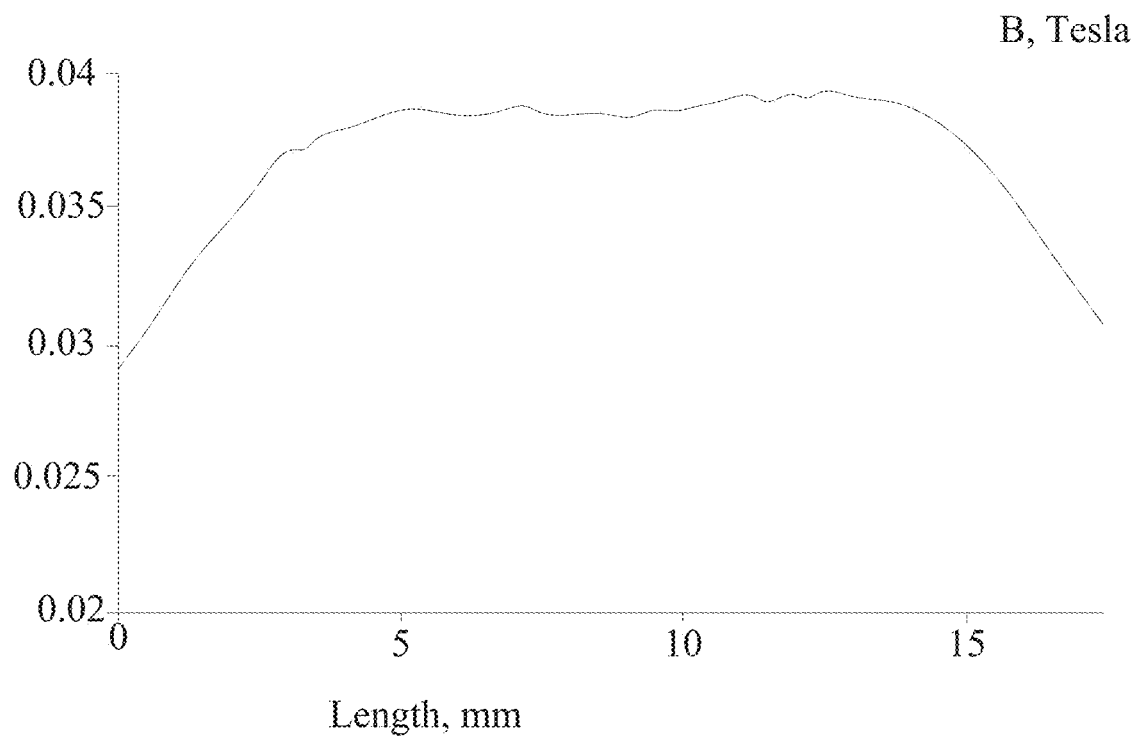
Figure 5B:
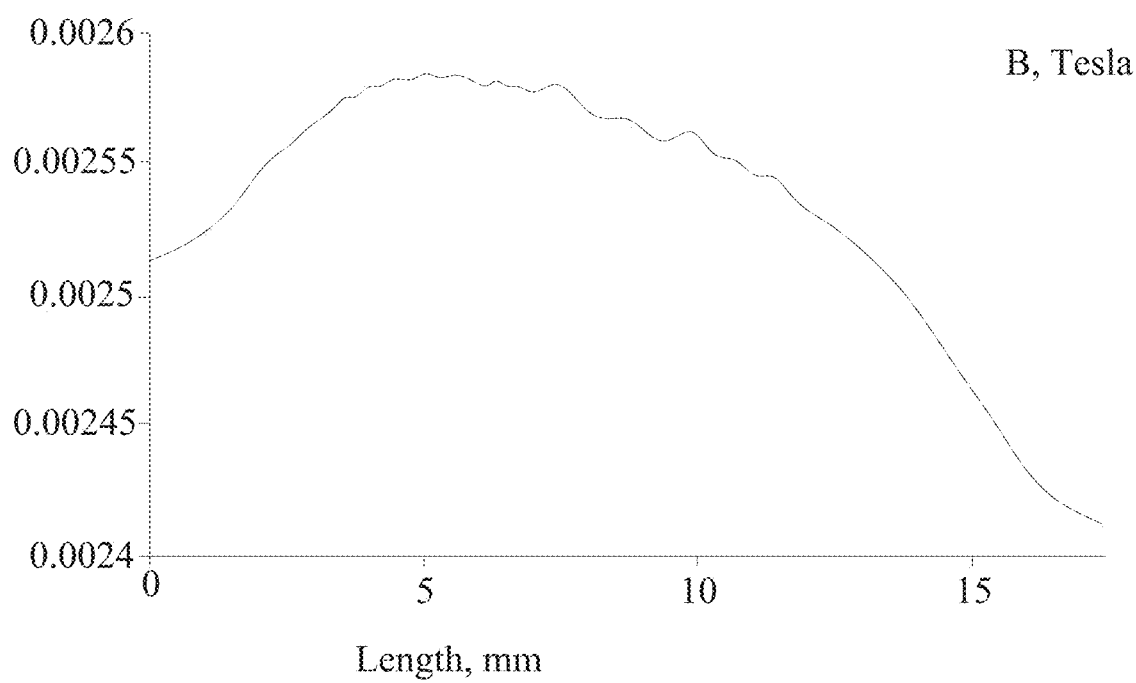
FIG. 5b is a curve of magnetic flux intensity of the embodiment shown in FIG. 4b.
Figure 5C:
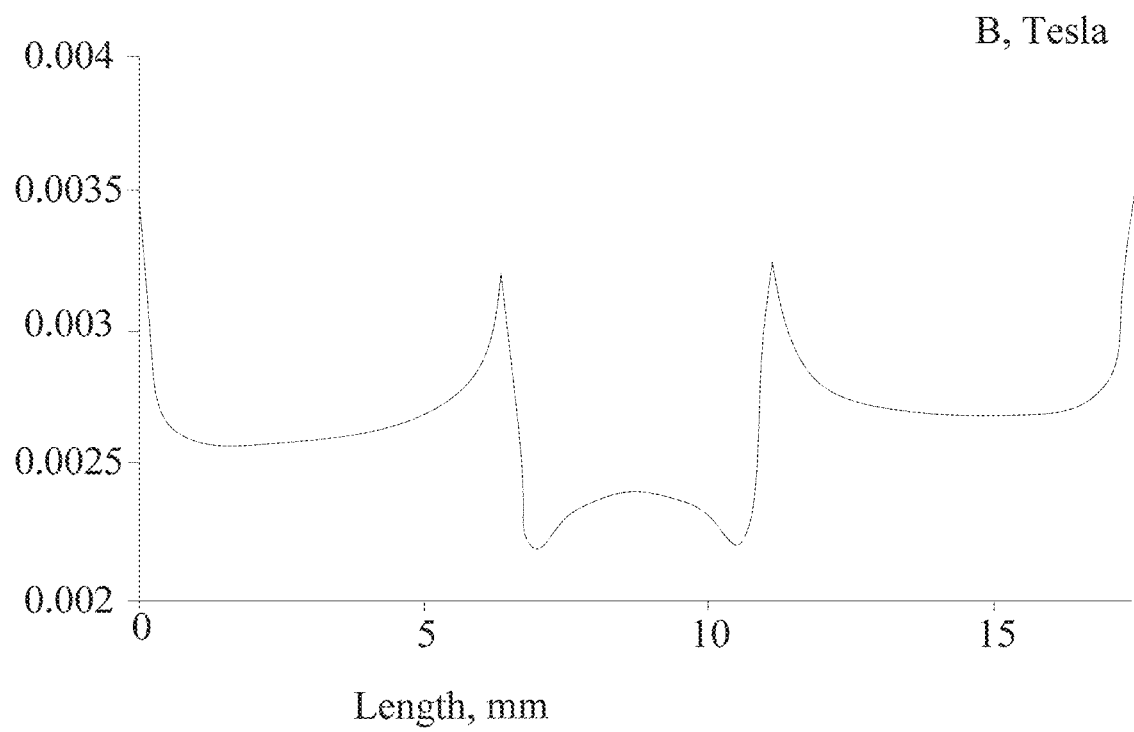
FIG. 5c is a curve of magnetic flux intensity of the embodiment shown in FIG. 4c.

In order to verify the above-mentioned loudspeaker assembly configured to prevent the magnetic leakage, a magnetic simulation test is performed to a loudspeaker assembly unarranged with the magnetic shielding cover 14, a loudspeaker assembly arranged with a flat magnetic shielding cover 14, and a loudspeaker assembly arranged with the curved magnetic shielding cover 14, test results are shown in FIGS. 4a to 5c. FIGS. 4a and 5a show magnetic simulation of the loudspeaker assembly unarranged with the magnetic shielding cover 14. As shown in the figures, significant magnetic leakage is detected in a front of the loudspeaker, and a magnetic flux density of a point c may be measured to be 0.0386 T. FIGS. 4b and 5b show magnetic simulation of the loudspeaker assembly arranged with the flat magnetic shielding cover 14. As shown in the figures, significant magnetic field shielding is detected on a side of the magnetic shielding cover 14 away from the loudspeaker body, and a magnetic flux density of a point c may be measured to be 0.00256 T. FIGS. 4c and 5c show magnetic simulation of the loudspeaker assembly arranged with the curved magnetic shielding cover 14. As shown in the figures, significant magnetic field shielding is detected on a side of the magnetic shielding cover 14 away from the loudspeaker body. A magnetic flux density of a point f of the recessed portion 142 may be measured to be 0.00238 T. A magnetic flux density of a point d of the connection portion 146 connecting to the recessed portion 142 and the flat portion 144 may be measured to be 0.0033 T. It may be understood that, when the scrap iron and the magnetic conductive substance reach the periphery of the sound transmission holes 140, the scrap iron and the magnetic conductive substance may firstly be adsorbed to the point d of the connection portion 146, such that the possibility of the scrap iron and the magnetic conductive substance entering the inside of the loudspeaker assembly through the sound transmission holes 140 may further be reduced.

Figure 6:
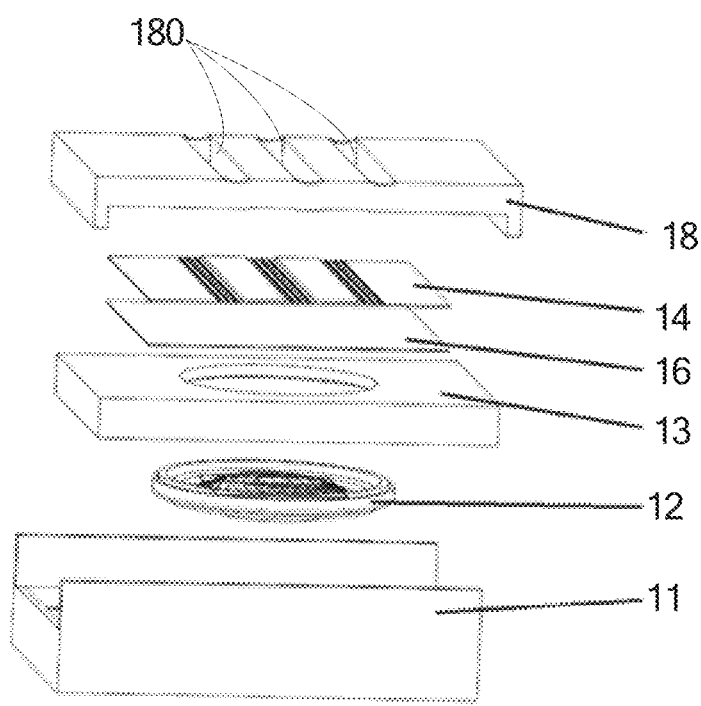
FIG. 6 is a structural schematic view of a loudspeaker assembly according to still another embodiment of the present disclosure.

As shown in FIG. 6, FIG. 6 is a structural schematic view of a loudspeaker assembly according to still another embodiment of the present disclosure. The loudspeaker assembly of the present disclosure may further include a dustproof 16. The dustproof 16 may be disposed between the loudspeaker body 12 and the magnetic shielding cover 14, and may be configured to prevent contaminations from entering the loudspeaker body 12 through the sound transmission holes 140. By configuring the dustproof 16 for isolation, the scrap iron, the magnetic conductive substance, or other contaminations may hardly enter the inside of the loudspeaker assembly, and proper operations of the loudspeaker body 12 may not be affected.

In an embodiment, the loudspeaker assembly may further include a shell 18. The shell 18 may be configured to cover the loudspeaker body 12 and the magnetic shielding cover 14. The magnetic shielding cover 14 may be disposed between the loudspeaker body 12 and the shell 18. Alternatively, the magnetic shielding cover 14 may be embedded into the shell 18. It may be understood that, the shell 18 may define an opening 180 corresponding to the sound transmission holes 140 in the magnetic shielding cover 14, such that sound transmission of the loudspeaker assembly may not be affected.

It may be understood that, a size of each sound transmission hole 140 in the magnetic shielding cover 14 may be determined based on the magnetic shielding effect and the sound transmission effect. In an embodiment, the sound transmission hole 140 in the magnetic shielding cover 14 may be circular, and a diameter of the sound transmission hole may be 0.8 mm to 1.2 mm. In another embodiment, the sound transmission hole 140 may be rectangular, and an area of the sound transmission hole may be 0.5 mm² to 1.2 mm². Of course, a shape and a size of the sound transmission hole 140 may be determined based on actual needs.

Further, without considering significant factors, a thickness of the magnetic shielding cover 14 may be increased appropriately to further improve the magnetic shielding effect. In an embodiment, the thickness of the magnetic shielding cover 14 may be 0.3 mm to 0.5 mm. The thickness of the magnetic shielding cover 14 may be determined based on actual needs.

Figure 7:
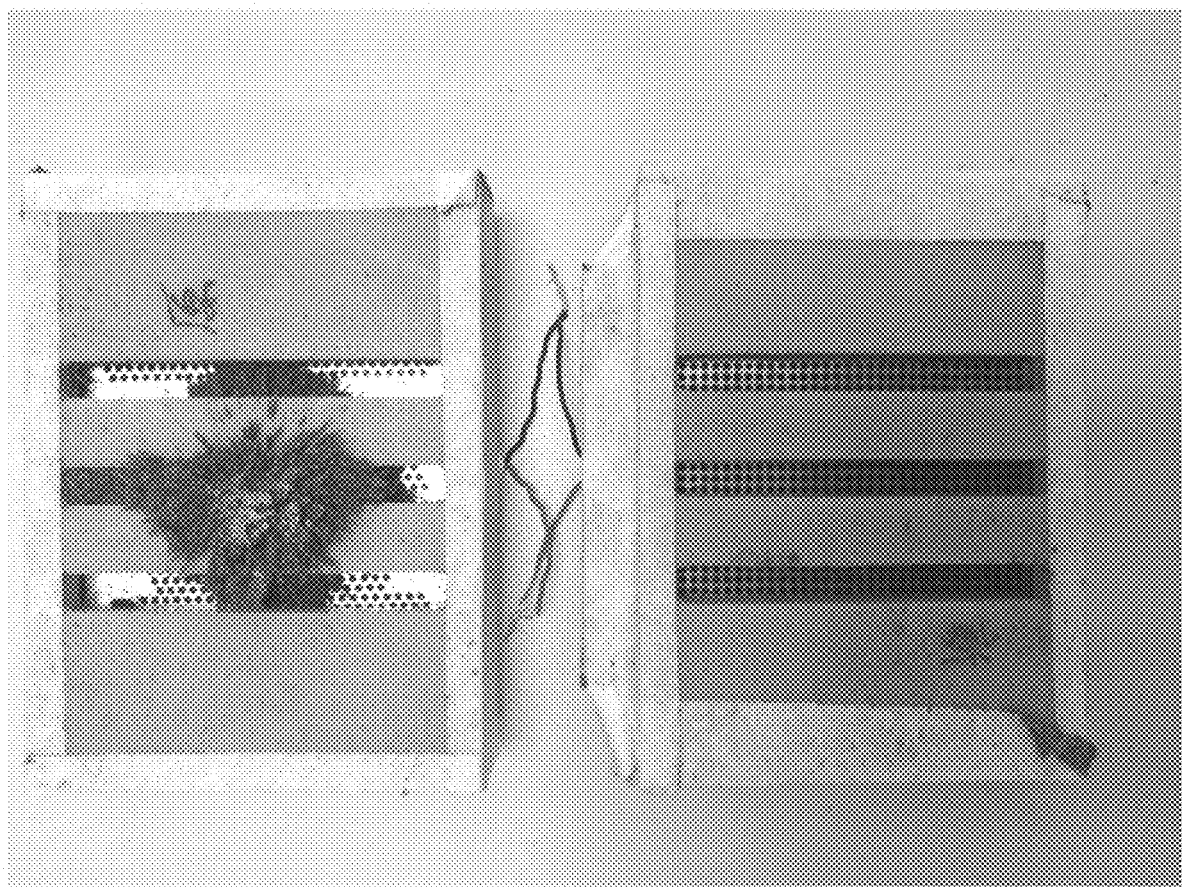
FIG. 7 is comparison between a scenario using a loudspeaker assembly according to an embodiment of the present disclosure and a scenario without using the loudspeaker assembly of the embodiment of the present disclosure.

In an embodiment, the magnetic shielding cover 14 may be made of magnetic conductive material, including but not limited to steel plate cold common (SPCC) material, low-magnetic steel, pure iron, magnetic-conductive stainless steel, silicon steel (hot rolling), silicon steel (cold rolled grain orientation), and other material having high magnetic permeability. It may be understood that, the higher the magnetic permeability, the greater the magnetic shielding effect. In this way, the magnetic shielding effect may be achieved, and at the same time, the magnetic shielding cover 14 may be lighter. Alternatively, the greater magnetic shielding effect may be achieved without changing a weight of the magnetic shielding cover 14, and this may be achieved by magnetic saturation of the material. In an embodiment, the SPCC material may be taken as an example. In order to verify the effect, a sound test is performed. As shown in FIG. 7, the loudspeaker assembly on a left side of the FIG. 7 may include a magnetic shielding cover 14 made of common stainless steel and a 300# dustproof 16. The loudspeaker assembly on a right side of the FIG. 7 may include a magnetic shielding cover 14 made of the SPCC material and the 300# dustproof 16. The sound radiation faces of the two loudspeaker assembly may be arranged to lie on iron powders. A rated power may be applied, and an operation of pink noise may be performed for 40 minutes and stopped. Actual rendering results are obtained and shown in FIG. 7. It may be shown that, compared to the common stainless steel, by configuring the magnetic shielding cover 14 made of the SPCC material, the magnetic shielding effect may be obvious, the outer side of the magnetic shielding cover 14 of the loudspeaker assembly may not be magnetic, such that the scrap iron and the magnetic conductive substance may be prevented from being adsorbed to the loudspeaker assembly effectively.

In other embodiments, the loudspeaker assembly may further include a back shell 11 and a support 13. In an embodiment, as shown in FIG. 6, the back shell 11, the support 13, and the loudspeaker body 12 may be assembled firstly, and the dustproof 16 may be disposed to the side of the sound radiation face of the loudspeaker body 12. Further, the magnetic shielding cover 14 may be disposed above the dustproof 16, and at last, the shell 18 may be covered. It may be understood that, the above-mentioned components may be adhered with each other by glue or by other means. In an embodiment, the shell 18 and the support 13 may be configured as an integral component. In this way, the magnetic shielding cover 14 may be embedded into the shell 18.

According to the above embodiments, the magnetic shielding cover 14 may be made of the ferromagnetic material and may be disposed at the side of the sound radiation face of the loudspeaker body 12, such that at least partial of the magnetic flux on the side of the sound radiation face of the loudspeaker body 12 may not pass through the magnetic shielding cover 14 and may be conducted back to the inertial magnetic field of the loudspeaker body 12 through the magnetic shielding cover 14. In this way, adsorbing the scrap iron or the magnetic conductive substance caused by the magnetic flux of the sound radiation face of the loudspeaker may be limited effectively, and the magnetic flux interfering other magnetic sensitive devices may be limited effectively. Further, the magnetic shielding cover 14 may be configured to be curved to further reduce the possibility of the scrap iron or the magnetic conductive substance entering the inside of the loudspeaker assembly through the sound transmission hole 140.

Further, the present disclosure may provide an electronic device including the loudspeaker assembly as described in the above embodiments.

To be specific, the electronic device may include a sound generating apparatus using an electromagnetic transducer loudspeaker for loud speaking, such as a conventional subwoofer, a Bluetooth small-sized subwoofer, an earphone, a mobile phone, an intercom, a navigator, and the like.

The above description shows embodiments of the present disclosure only, but does not limit the scope of the present disclosure. Any equivalent structural or principle transformation based on the specification and the drawings of the present disclosure, directly or indirectly applied in other related art, should also be within the scope of the present disclosure.

What is claimed is:

1. A loudspeaker assembly, comprising:
   a loudspeaker body having a sound radiation face;
   a magnetic shielding cover, arranged on a side of the sound radiation face of the loudspeaker body and defining a sound transmission hole,
      wherein the magnetic shielding cover is a ferromagnetic cover;
      the magnetic shielding cover is configured to prevent at least partial magnetic flux on the side of the sound radiation face of the loudspeaker body from passing through the magnetic shielding cover, and configured to conduct the at least partial magnetic flux back to an inertial magnetic field of the loudspeaker body; and
      magnetic induction of a portion of the magnetic shielding cover away from a periphery of the sound transmission hole is greater than magnetic induction of a portion of the magnetic shielding cover close to the periphery of the sound transmission hole;
   wherein the magnetic shielding cover is a curved magnetic conductive plate;
   the magnetic shielding cover comprises a recessed portion and a flat portion, the recessed portion is recessed towards the loudspeaker body, the flat portion is protruded towards a position away from the loudspeaker body;
   the recessed portion is the portion of the magnetic shielding cover close to the periphery of the sound transmission hole; and
   the flat portion is the portion of the magnetic shielding cover away from the periphery of the sound transmission hole.

2. The loudspeaker assembly according to claim 1, wherein
   the magnetic shielding cover further comprises a connection portion, connected to the recessed portion and the flat portion, and the connection portion is curved or flat.

3. The loudspeaker assembly according to claim 1, further comprising:
   a dustproof net, disposed between the loudspeaker body and the magnetic shielding cover and configured to prevent contaminations from entering the loudspeaker body through the sound transmission hole.

4. The loudspeaker assembly according to claim 1, further comprising:
a shell, configured to cover the loudspeaker body and the magnetic shielding cover,
wherein the magnetic shielding cover is disposed between the loudspeaker body and the shell, or embedded into the shell.

5. The loudspeaker assembly according to claim 1, wherein
the sound transmission hole is circular, and a diameter of the sound transmission hole is 0.8 mm to 1.2 mm.

6. The loudspeaker assembly according to claim 1, further comprising: a back shell and a support, wherein
the back shell is arranged at a side of the loudspeaker body opposite to the sound radiation face;
the support is configured to fix the loudspeaker body on the back shell;
the back shell, the support, the loudspeaker body, and the magnetic shielding cover are adhered to each other.

7. The loudspeaker assembly according to claim 1, wherein a thickness of the magnetic shielding cover is 0.3 mm to 0.5 mm.

8. The loudspeaker assembly according to claim 1, wherein the magnetic shielding cover is magnetic conductive, and the magnetic shielding cover is a SPCC cover, a low-magnetic steel cover, a pure iron cover, a magnetic-conductive stainless steel cover, a hot-rolled silicon steel cover, or a cold rolled grain-orientated silicon steel cover.

9. A sound generating apparatus, comprising:
a front shell and a back shell, engaged with each other to define a chamber;
a support, received in the chamber;
a loudspeaker body, received in the chamber and disposed between the support and the back shell, wherein the loudspeaker has a sound radiation face for transmitting sound radiation to an outside of the sound generating apparatus, the sound radiation face faces the front shell; and
a magnetic shielding cover, received in the chamber and disposed between the support and the front shell,
wherein the magnetic shielding cover defines a sound transmission hole;
the magnetic shielding cover has a first portion close to a periphery of the sound transmission hole and a second portion away from the periphery of the sound transmission hole;
the first portion has a first magnetic induction, the second portion has a second magnetic induction, the first magnetic induction is greater than the second magnetic induction;
wherein the magnetic shielding cover is curved, an edge of the magnetic shielding cover is configured to surround the first portion and the second portion and is inclined towards the loudspeaker body;
the magnetic shielding cover further comprises a connection portion connected to the first portion and the second portion, such that two surfaces of the magnetic shielding cover facing the front shell and facing the loudspeaker body are uneven.

10. The sound generating apparatus according to claim 9, wherein the first portion is closer to the loudspeaker body, and the second portion is closer to the front shell.

11. The sound generating apparatus according to claim 9, wherein the connection portion is curved.

12. The sound generating apparatus according to claim 9, further comprising a dustproof net, disposed between the loudspeaker body and the magnetic shielding cover and configured to prevent contaminations from entering the loudspeaker body through the sound transmission hole.

13. The sound generating apparatus according to claim 9, the back shell, the support, the loudspeaker body, and the magnetic shielding cover are adhered to each other.

14. The sound generating apparatus according to claim 9, the first portion has a first thickness, the second portion has a second thickness, the first thickness is different from the second thickness.

15. The sound generating apparatus according to claim 9, the first portion has a first magnetic permeability, the second portion has a second magnetic permeability, and the first magnetic permeability is different from the second magnetic permeability.

16. The sound generating apparatus according to claim 9, wherein the magnetic shielding cover is a cover selected from the group consisting of: a SPCC cover, a low-magnetic steel cover, a pure iron cover, a magnetic-conductive stainless steel cover, a hot-rolled silicon steel cover, and a cold rolled grain-orientated silicon steel cover.

17. An electronic device, comprising a sound generating apparatus, wherein the sound generating apparatus comprises: a front shell and a back shell, engaged with each other to define a chamber;
a support, received in the chamber;
a loudspeaker body, received in the chamber and disposed between the support and the back shell, wherein the loudspeaker has a sound radiation face for transmitting sound radiation to an outside of the sound generating apparatus, the sound radiation face faces the front shell; and
a magnetic shielding cover, received in the chamber and disposed between the support and the front shell,
wherein the magnetic shielding cover defines a sound transmission hole;
the magnetic shielding cover has a first portion close to a periphery of the sound transmission hole and a second portion away from the periphery of the sound transmission hole;
the first portion has a first magnetic induction, the second portion has a second magnetic induction, the first magnetic induction is greater than the second magnetic induction;
wherein the magnetic shielding cover is curved, an edge of the magnetic shielding cover is configured to surround the first portion and the second portion and is inclined towards the loudspeaker body;
the magnetic shielding cover further comprises a connection portion connected to the first portion and the second portion, such that two surfaces of the magnetic shielding cover facing the front shell and facing the loudspeaker body are uneven.

* * * * *